(12) United States Patent
Nakamura et al.

(10) Patent No.: US 8,746,907 B2
(45) Date of Patent: Jun. 10, 2014

(54) FLUORESCENT TUBE TYPE LED LAMP

(75) Inventors: Yasuo Nakamura, Shizuoka (JP);
Norihiko Kobayashi, Shizuoka (JP);
Hisayoshi Daicho, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 38 days.

(21) Appl. No.: 13/419,861

(22) Filed: Mar. 14, 2012

(65) Prior Publication Data

US 2012/0236533 A1 Sep. 20, 2012

(30) Foreign Application Priority Data

Mar. 14, 2011 (JP) ................................ 2011-055305

(51) Int. Cl.
*F21V 9/16* (2006.01)

(52) U.S. Cl.
USPC .......................... 362/84; 362/249.02; 362/235

(58) Field of Classification Search
USPC ............... 362/223, 249.02, 217.08, 235, 294, 362/311.02, 84
See application file for complete search history.

(56) References Cited

U.S. PATENT DOCUMENTS

2009/0140271 A1 * 6/2009 Sah ................................. 257/88

FOREIGN PATENT DOCUMENTS

| JP | 2007-122933 A | 5/2007 |
| JP | 2010-153384 A | 7/2010 |

* cited by examiner

*Primary Examiner* — Anne Hines
(74) *Attorney, Agent, or Firm* — Osha Liang LLP

(57) ABSTRACT

A fluorescent tube type LED lamp includes an elongated lamp body that has a largest dimension in a longitudinal direction, a light source substrate mounted on the lamp body, a light transmissive cover attached to the lamp body, and an LED unit mounted on the light source substrate such that the LED unit extends in the longitudinal direction of the lamp body. The LED unit includes a plurality of LED chips mounted on the light source substrate, and a transparent encapsulant encapsulating the LED chips. The encapsulant is molded such that the encapsulant is raised from the light source substrate. The LED unit radiates light from an entire surface of the encapsulant in an angular range including a region lateral to the lamp body.

6 Claims, 6 Drawing Sheets

FLUORESCENT TUBE TYPE LED LAMP

CROSS-REFERENCE TO RELATED APPLICATIONS

The present application claims priority from Japanese Patent Application No. 2011-055305 filed on Mar. 14, 2011, the entire content of which is incorporated herein by reference.

BACKGROUND OF INVENTION

1. Field of the Invention

The present invention relates to a fluorescent tube type LED lamp using light emitting diodes (LEDs) as light sources.

2. Related Art

Related art fluorescent tube type LED lamps are configured such that a plurality of LED light sources are arranged on a substrate accommodated in an elongated lamp body.

For example, a related art fluorescent tube type LED lamp includes a substrate and LED light sources arranged on the substrate in a line, and the substrate is supported so as to be rotatable about an axis extending in the longitudinal direction of the substrate, so that the light distribution amount in the widthwise direction of the lamp body can be adjusted (see, e.g., JP2007-122933A).

According to another related art, a plurality of light source substrates are arranged in a line in the longitudinal direction of the lamp body, and LED light sources are arranged on each of the substrates. The adjacent substrates are connected together via respective connectors (see, e.g., JP2010-153384A).

However, according to the related art fluorescent tube type LED lamps, due to the use of multiple LED light sources, the light sources appear in a spotted manner. Thus, continuous light emission as in a fluorescent tube lamp cannot be obtained. Further, because the LEDs have a strong directivity, although sufficient light quantity may be obtained in a region directly below the lamp, there is a lack of light quantity in a region lateral to the lamp. For example, as shown in a broken line in FIG. 4, with respect to 1 being the illuminance at the radiation angle of 0° (directly below the lamp), relative illuminance lowers as the radiation angle becomes wide, and may become 0 at the radiation angle of 90° (directly lateral to the lamp).

SUMMARY OF INVENTION

One or more embodiments of the present invention provides a fluorescent tube type LED lamp capable of forming a continuous light emission that does not appear in a spotted manner, with sufficient amount of light radiated in a region lateral to the lamp.

According to one or more embodiments of the present invention, a fluorescent tube type LED lamp is provided. The fluorescent tube type LED lamp includes an elongated lamp body, a light source substrate mounted on the lamp body, a light transmissive cover attached to the lamp body, and an LED unit mounted on the light source substrate such that the LED unit extends in a longitudinal direction of the lamp body. The LED unit includes a plurality of LED chips mounted on the light source substrate, and a transparent encapsulant encapsulating the LED chips. The encapsulant is molded such that the encapsulant is raised from the light source substrate. The LED unit radiates light from an entire surface of the encapsulant in an angular range including a region lateral to the lamp body.

Other aspects and advantages of the invention will be apparent from the following description, the drawings and the claims.

DETAILED DESCRIPTION OF THE EMBODIMENTS

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
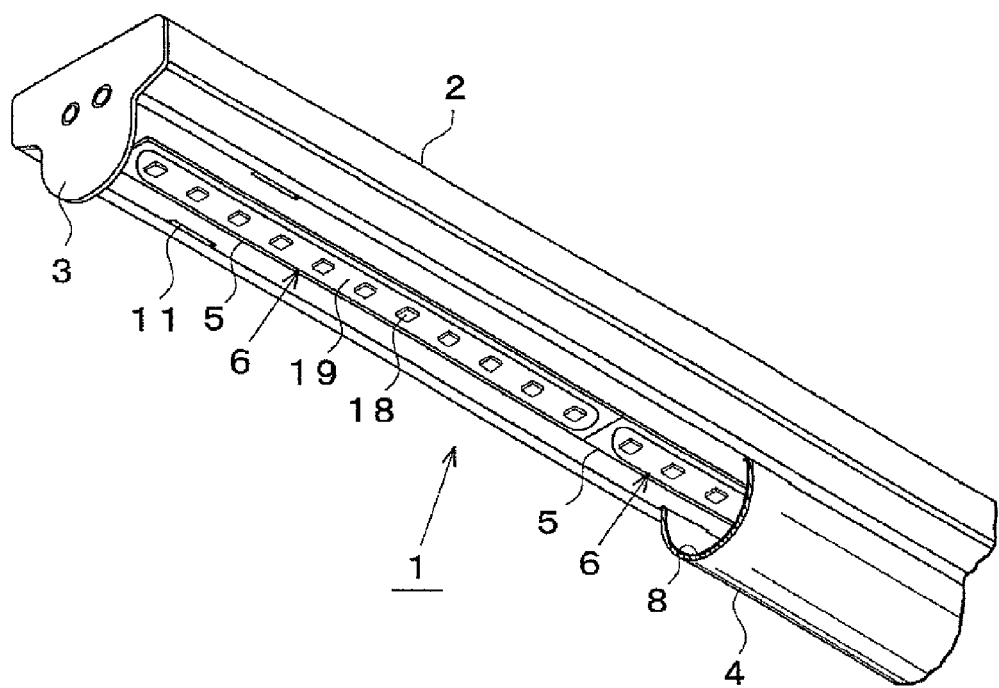
FIG. 1 is a perspective view of a fluorescent tube type LED lamp according to one or more embodiments of the present invention.

As shown in FIG. 1, a fluorescent tube type LED lamp 1 according to one or more embodiments of the present invention includes an elongated lamp body 2 adapted to be mounted onto a surface of a ceiling or a wall. The LED lamp 1 further includes end plates 3 attached to the respective ends of the lamp body 2, and a light transmissive cover 4 attached to the lower side of the lamp body 2. Inside the light transmissive cover 4, a light source substrate 5 is mounted on the lower surface of the lamp body 2, and an LED unit 6 is mounted on the light source substrate 5. The LED unit 6 emits white visible light in a continuous manner to illuminate a wide area inside the room through the light transmissive cover 4.

Figure 2:
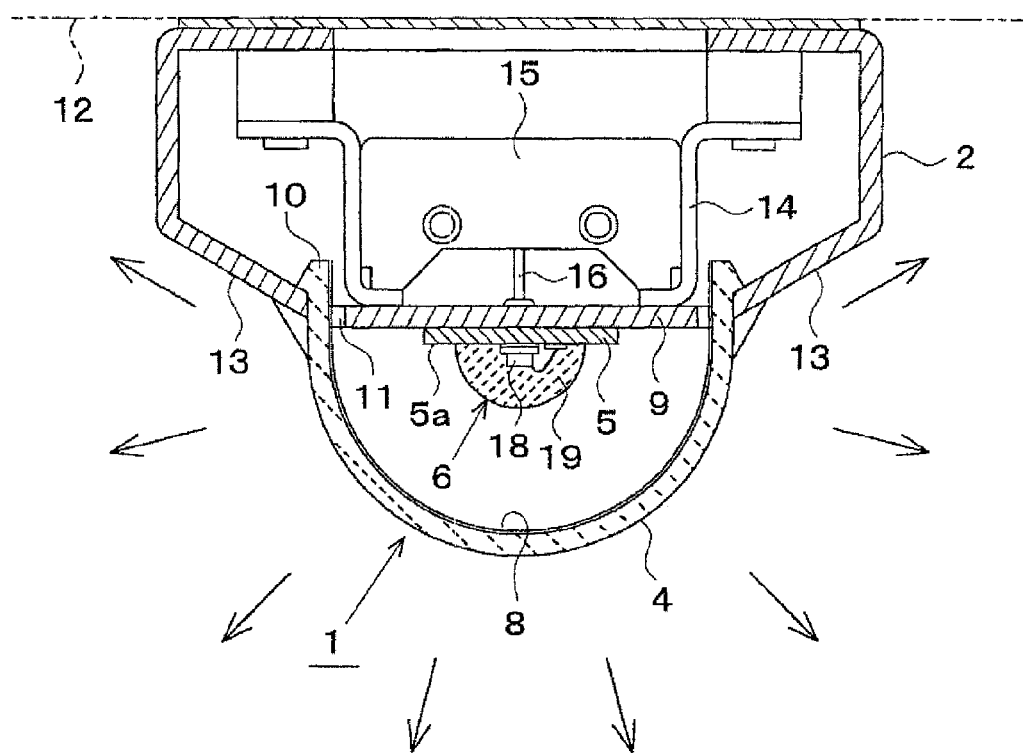
FIG. 2 is a vertical sectional view of the LED lamp.

As shown in FIG. 2, a light diffusing layer 8 is provided on an inner surface of the light transmissive cover 4. In addition, or alternatively, the light transmissive cover 4 may be molded from light diffusion grade resin. The lamp body 2 is formed in a hollow tube shape by sheet-metal working. The lamp body 2 includes a substrate mounting portion 9. On each side of the substrate mounting portion 9, an engagement hole 11 is formed. The light transmissive cover 4 has an attaching protrusion 10 on each side that engages with the corresponding engagement hole 11. The right and left shoulder portions of the lamp body 2 are respectively formed in an upwardly oblique shape to provide light guide portions 13 for guiding a part of the light from the LED unit 6 toward a lamp mounting surface 12. Inside the lamp body 2, a power supply unit 15 is installed via a bracket 14 to convert a commercial alternating-current power supply to a direct-current voltage and to supply the direct-current voltage to the LED unit 6 through a lead wire 16.

As shown in FIGS. 1 and 2, the light source substrate 5 is an elongated metal plate, and the LED unit 6 is formed to extend in the longitudinal direction of the lamp body 2. The LED unit 6 has substantially the same length as the light source substrate 5. The LED unit 6 includes a plurality of LED chips 18 that emit ultraviolet light or near ultraviolet light, and a transparent encapsulant 19 continuously encapsulating the LED chips 18. The encapsulant 19 is molded in a band shape having a semicircular cross section, and encapsulates the LED chips 18 almost at regular intervals. The LED unit 6 and the substrate 5 together form a bar-shaped LED package. Depending on the length of the lamp body 2, a plurality of LED packages are provided, and are serially connected, as shown in FIG. 1.

Figure 3:
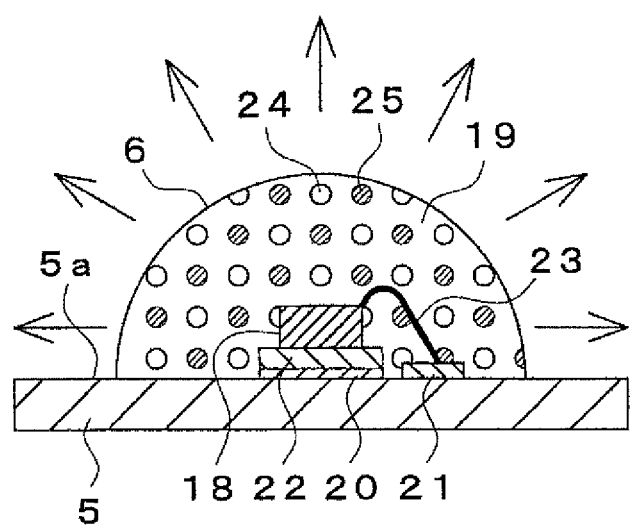
FIG. 3 is a sectional view of an LED unit of the LED lamp.

As shown in FIG. 3, an anode 20 and a cathode 21 are provided on the chip mounting surface 5a of the light source substrate 5 by Au plating, and the LED chip 18 is mounted on the anode 20 via an Ag paste 22. The LED chip 18 is a semiconductor light emitting device having a light emission peak in the wavelength range of 380 nanometers (nm) to 420 nm. An upper surface of the LED chip 18 is connected to the cathode 21 via an Au wire 23. The encapsulant 19 encapsulates the Au wire 23 together with the LED chip 18. The encapsulant 19 is made of transparent silicone resin, and is molded such that the encapsulant 19 is raised from the chip mounting surface 5a of the light source substrate 5. The encapsulant 19 is bonded to the chip mounting surface 5a at a bottom surface of the encapsulant 19, and the encapsulant's entire surface, except the bottom surface, is exposed to allow the LED unit 6 to radiate light from the entire surface of the encapsulant 19 in a wide angular range including the region lateral to the lamp body 2.

The encapsulant 19 contains a plurality of types of phosphors for wavelength conversion from the ultraviolet light or the near ultraviolet visible light emitted by the LED chip 18 to visible white light. According to one or more embodiments of the present invention, two types of phosphors 24, 25 are contained in the encapsulant 19. The first phosphor 24 absorbs the light emitted by the LED chip 18, and emits yellow visible light having a peak wavelength in the range of 560 nanometers (nm) to 600 nm. The second phosphor 25 absorbs the light emitted by the LED chip 18, and emits blue visible light having a peak wavelength in the range of 430 nm to 480 nm. The first and second phosphors 24, 25 are dispersed uniformly in the silicone resin, and by the mixture of blue and yellow lights, which are complementary colors, the encapsulant 19 emits white visible light in a Lambertian manner from the entire surface of the encapsulant 19.

The yellow light emitting first phosphor 24 may be a composition expressed by a general formula $(Ca_{1-x-y}Sr_xRe_y)_7(SiO_3)_7X_2$, wherein Re includes $Eu^{2+}$, a rare-earth element and $Mn^{2+}$, and wherein X includes Ce and a halogen element.

The blue light emitting second phosphor 25 may be a composition expressed by one of the following general formulae (1) to (4).

(1) $M^1_a(M^2O_4)_bX_c:Re_d$, wherein $M^1$ includes at least one element selected from a group consisting of Ca, Sr and Ba and may partially be replaced with an element selected from a group consisting of Mg, Zn, Cd, K, Ag and Tl, wherein $M^2$ includes P and may partially be replaced with an element selected from a group consisting of V, Si, As, Mn, Co, Cr, Mo, W and B, wherein X includes at least one kind of halogen element, wherein Re includes at least one kind of rare-earth element or Mn and essentially contains $Eu^{2+}$, wherein $4.2 \leq a \leq 5.8$, wherein $5 \leq b \leq 3.5$, wherein $0.8 < c < 1.4$, and wherein $0.01 < d < 0.1$.

(2) $M^1_{1-a}MgAl_{10}O_{17}:Eu^{2+}_a$, wherein $M^1$ includes at least one element selected from a group consisting of Ca, Sr, Ba and Zn, and wherein $0.001 \leq a \leq 0.5$.

(3) $M^1_{1-a}MgSi_2O_8:Eu^{2+}_a$, wherein $M^1$ includes at least one element selected from a group consisting of Ca, Sr, Ba and Zn, and wherein $0.001 \leq a \leq 0.8$.

(4) $M^1_{2-a}(B_5O_9)X:Re_a$, wherein $M^1$ includes at least element selected from a group consisting of Ca, Sr, Ba and Zn, wherein X includes at least halogen element, and wherein $0.001 \leq a \leq 0.5$.

The fluorescent tube type LED lamp 1 described above is advantageous in, for example, the following aspects.

The LED unit 6 is formed in an elongated manner such that the band-shaped encapsulant 19 continuously encapsulates the LED chips 18. Therefore, the LED chips 18 do not appear in a spotted manner, so that the LED unit 6 emits light continuously along the entire length of the LED unit 6 in a substantially uniform manner like a fluorescent tube lamp.

Figure 4:
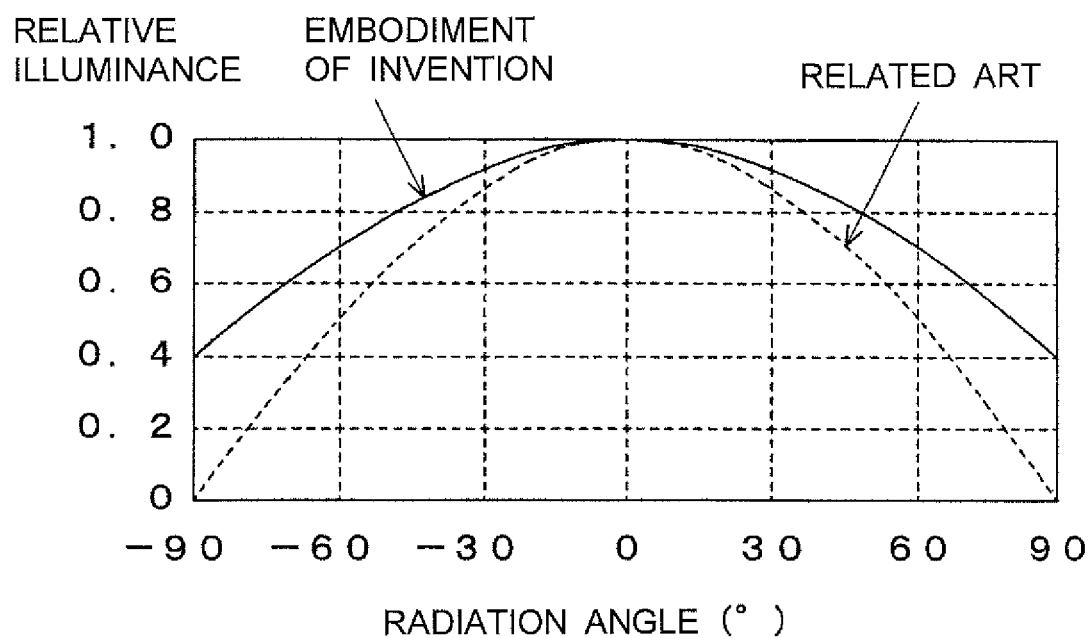
FIG. 4 is a diagram illustrating a light distribution pattern of an LED lamp according to one or more embodiments of the present invention and a light distribution pattern of a related art LED lamp.

The encapsulant 19 is molded such that that the encapsulant 19 is raised from the chip mounting surface 5a of the light source substrate 5. Therefore, light emitted by each of the LED chip 18 can be distributed in a wide angular range, so that the amount of light distributed to the region lateral to the lamp body 2 can be increased. For example, as shown in FIG. 4, the relative illuminance at the radiation angle of 90° can be 0.4, thereby providing a light distribution pattern that is substantially equivalent to existing fluorescent tube lamps.

The light guide portions 13 are obliquely formed on the respective shoulder portions of the lamp body 2. Therefore, a part of the light emitting by the LED unit 6 can be guided to travel toward the lamp mounting surface 12.

The encapsulant 19 contains the yellow light emitting first phosphors and the blue light emitting phosphors in the transparent silicone resin in a uniformly distributed manner. Thus, the ultraviolet light or the near ultraviolet visible light emitted by each of the LED chips 18 can be wavelength-converted to visible white light efficiently, color fluctuations of light emission can be suppressed, in particular, in a region lateral to the LED lamp 1, and a wide range can be brightly illuminated with uniform white visible light.

The blue light emitting second phosphor 25 hardly absorbs the yellow light from the first phosphor 24. Thus, despite the raised shape of the encapsulant 19, color fluctuations in the emitted light resulting from multiple excitation (cascade excitation) can be suppressed.

The light diffusing layer 8 is provided on the inner surface of the light transmissive cover 4. Thus, the light emitted by the LED unit 6 is efficiently and uniformly diffused in the region around the LED lamp 1.

While description has been made in connection with certain embodiments of the present invention, those skilled in the art, having benefit of this disclosure, will appreciate that various changes and modification may be made therein without departing from a scope of the present invention. Accordingly, the scope of the invention should be limited only by the appended claims.

Figure 5:
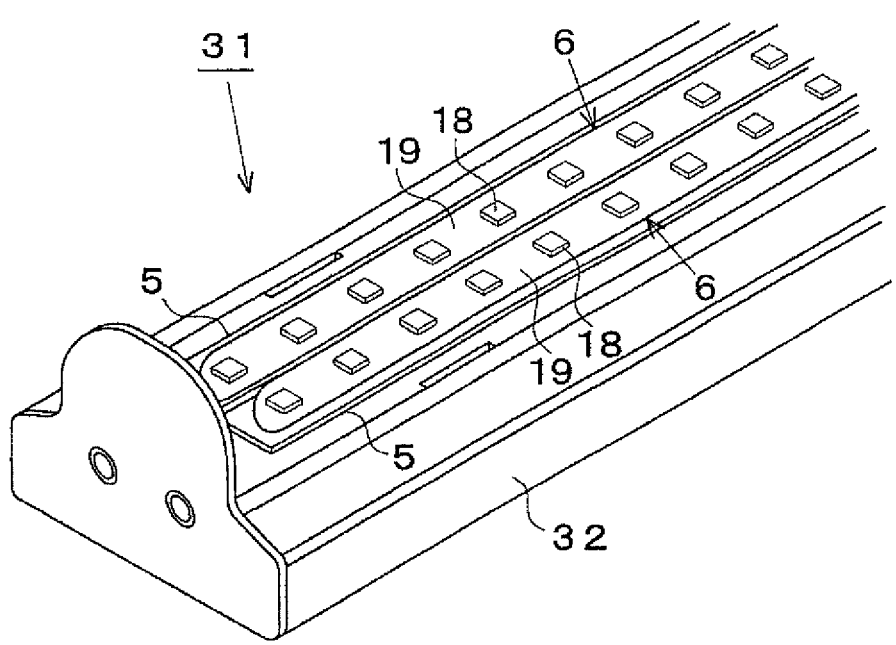
FIG. 5 is a perspective view of a portion of a fluorescent tube type LED lamp according to one or more embodiments of the present invention.

For example, as shown in FIG. 5, light source substrates 5 and LED units 6 may be arranged on a wider lamp body 32 in two or more lines, thereby providing a fluorescent tube type LED lamp 31 capable of illuminating a wider range.

Figure 6:
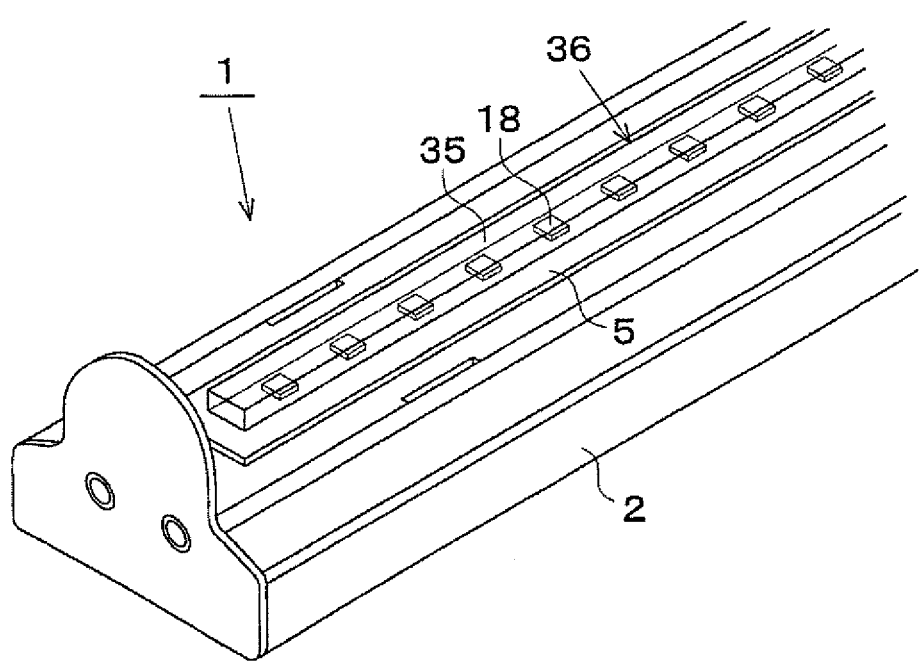
FIG. 6 is a perspective view of a portion of a fluorescent tube type LED lamp according to one or more embodiments of the present invention.

As shown in FIG. 6, an encapsulant 35 may be molded in a band shape having a rectangular cross section, so that an LED unit 36 is formed in a prism shape as a whole. The encapsulant may be formed in other various raised shapes, e.g., having a triangular, a trapezoidal, or a polygonal cross section.

What is claimed is:

1. A fluorescent tube type LED lamp comprising:
an elongated lamp body that has a largest dimension in a longitudinal direction thereof;
a light source substrate mounted on the lamp body;
a light transmissive cover attached to the lamp body; and
an LED unit mounted on the light source substrate such that the LED unit extends in the longitudinal direction of the lamp body,
wherein the LED unit comprises a plurality of LED chips and a transparent encapsulant encapsulating the LED chips,
wherein the LED chips are mounted on the light source substrate, wherein the encapsulant is molded such that the encapsulant is raised from the light source substrate,
wherein the LED unit radiates light from an entire surface of the encapsulant in an angular range including a region lateral to the lamp body,
wherein space is provided between the encapsulant and the light transmissive cover, and
wherein each of the LED chips emits ultraviolet light or near ultraviolet visible light, and the encapsulant contains a plurality of types of phosphors to wavelength-convert the light emitted by each of the LED chips to white visible light.

2. The fluorescent tube type LED lamp according to claim 1, wherein the encapsulant is molded in a band shape such that the encapsulant continuously encapsulates the plurality of LED chips.

3. The fluorescent tube type LED lamp according to claim 1, wherein the lamp body comprises a light guide portion configured to guide a part of the light from the LED unit toward a surface on which the fluorescent tube type LED lamp is mounted.

4. The fluorescent tube type LED lamp according to claim 1, further comprising a light diffusing layer provided on an inner surface of the light transmissive cover.

5. The fluorescent tube type LED lamp according to claim 1, wherein the encapsulant encapsulates the plurality of LED chips such that the encapsulant is in contact with top and side surfaces of each of the plurality of LED chips.

6. The fluorescent tube type LED lamp according to claim 1, wherein the encapsulant is molded from transparent silicone resin.

* * * * *